US008435874B2

(12) United States Patent
Warrick et al.

(10) Patent No.: US 8,435,874 B2
(45) Date of Patent: May 7, 2013

(54) METHOD OF FORMING OPENINGS IN A SEMICONDUCTOR DEVICE AND A SEMICONDUCTOR DEVICE FABRICATED BY THE METHOD

(75) Inventors: Scott Warrick, Austin, TX (US); Massud Abubaker Aminpur, Crolles (FR); Will Conley, Montbonnot-St Martin (FR); Lionel Riviere-Cazeaux, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 342 days.

(21) Appl. No.: 12/812,035

(22) PCT Filed: Jan. 23, 2008

(86) PCT No.: PCT/IB2008/051303
§ 371 (c)(1),
(2), (4) Date: Jul. 8, 2010

(87) PCT Pub. No.: WO2009/093102
PCT Pub. Date: Jul. 30, 2009

(65) Prior Publication Data
US 2010/0291770 A1    Nov. 18, 2010

(51) Int. Cl.
*H01L 21/20* (2006.01)
(52) U.S. Cl.
USPC .................. 438/584; 438/618; 438/639
(58) Field of Classification Search ............... None
See application file for complete search history.

(56) References Cited

U.S. PATENT DOCUMENTS 4,707,218 A    11/1987 Giammarco et al.
5,705,301 A    1/1998 Garza et al.
6,074,787 A    6/2000 Takeuchi
6,150,059 A    11/2000 Tanabe et al.
6,187,671 B1*  2/2001 Irinoda ................... 438/639
6,228,747 B1*  5/2001 Joyner ..................... 438/436
6,498,105 B1   12/2002 Kim
6,784,005 B2   8/2004 Lin et al.
7,083,898 B1   8/2006 Bailey et al.
2004/0029052 A1  2/2004 Park et al.
2005/0138598 A1  6/2005 Kokubun
2005/0148169 A1  7/2005 Frost et al.
2006/0190920 A1  8/2006 Sakurai et al.

OTHER PUBLICATIONS

Op De Beeck Maaike et al: "A Novel Plasma-Assisted Shrink Process to Enlarge Process Windows of Narrow Trenches and Contacts for 45nm Node Applications and Beyond" Advances in Resist Materials and Processing Technology XXIV, San Jose, CA, USA, Feb. 26, 2007, Proc. SPIE, vol. 6519, 65190U (2007).
International Search Report and Written Opinion correlating to PCT/IB2008/051303 dated Oct. 20, 2008.

* cited by examiner

*Primary Examiner* — Duy Deo (57) ABSTRACT

A method of forming openings to a layer of a semiconductor device comprises forming a dielectric layer over the layer of the semiconductor device, and forming a mask over the dielectric layer. The mask comprises a plurality of mask openings arranged in a regular pattern extending over the dielectric layer and the plurality of mask openings include a plurality of first mask openings and a plurality of second mask openings, each of the plurality of first mask openings being greater in size than each of the plurality of second mask openings. The method further comprises reducing the size of the plurality of second mask openings such that each of the second mask openings is substantially closed and removing portions of the dielectric layer through the plurality of first mask openings to provide openings extending through the dielectric layer to the layer.

20 Claims, 7 Drawing Sheets

METHOD OF FORMING OPENINGS IN A SEMICONDUCTOR DEVICE AND A SEMICONDUCTOR DEVICE FABRICATED BY THE METHOD

FIELD OF THE DISCLOSURE

This disclosure relates to a method of forming openings to a layer of a semiconductor device and a semiconductor device.

BACKGROUND

Manufacturing processes for semiconductor devices and Integrated Circuits (ICs) (including semiconductor devices) include a number of lithographic processes to transfer geometric patterns representing the design layout of the different features of a semiconductor device or an IC from reticles or lithographic masks to a light-sensitive chemical (known as photoresist or resist) on a surface of a semiconductor wafer or die to form masks on the semiconductor wafer. The layout patterns on the wafer as defined by the masks are then used in subsequent process steps to manufacture the semiconductor device or IC. In a complex IC (for example, a CMOS IC), the wafer will go through a lithographic process up to 50 times.

In optics, the Depth of Focus (DoF) is the distance in front of and beyond the subject that appears to be in focus. In the manufacture of semiconductor devices and ICs, the layout patterns of the features of the semiconductor device including all the smaller features (for 32 nm technology, the smaller features include the contact holes which will be in the range of 50-60 nm after lithography) are transferred to the wafer using lithographic processes. Illumination conditions of the lithographic processes are chosen to balance DoF as well as exposure latitude and the illumination conditions include parameters such as wavelength of light used, size of lens aperture and other parameters of the lithographic equipment.

For features which are to be formed in the same layer of the wafer and which require layout patterns on the lithographic mask which look different or have different densities or pitches (the pitch being the distance between adjacent layout patterns), for a single exposure using a single illumination condition, the process window or Depth of Focus (DoF) for such a lithographic mask is small and is limited by the number of different pitches. For example, the illumination conditions, such as wavelength of light used, and size of lens aperture, for a lithographic mask comprising only a dense regular pattern can be optimised for the dense regular pattern to provide a large process window or DoF and similarly the illumination conditions for a lithographic mask comprising only isolated patterns can be optimised for the isolated patterns to provide a large process window or DoF. However, for a combination of dense regular patterns and isolated patterns on a single lithographic mask for the same layer of the wafer, a compromise in the illumination conditions has to be made which reduces the size of the process window or DoF.

As the dimensions of the design layout patterns on the lithographic mask decrease, the DoF decreases and there is a limit to the DoF below which lithographic techniques cannot be used to transfer features of a semiconductor device to a surface of a wafer. With the trend to shrink the size of devices which results in the reduction of the dimensions of features, it is becoming harder to print small features, such as contact holes, vias, connection lines, using lithographic techniques due to the limit of the DoF and achievable resolution.

Different techniques have been developed to maximise the size of the process window or DoF, in particular for layout patterns in the same layer having different pitches or incompatible densities. For example, one technique uses a double patterning method in which two lithographic masks are used along with two exposures under different illumination conditions and two etch steps. In the example given above, one of the masks is used to transfer the dense regular patterns to the wafer and the other mask is used to transfer the isolated patterns. However, with this method two lithographic masks and two etch steps are required which increases the cost of such a process. Furthermore for features having small dimensions, such as contact holes, which require critical masks, the requirement of two critical masks significantly increases the manufacturing costs. U.S. Pat. No. 6,498,105 describes a double patterning method.

Another technique uses a double exposure method in which one resist layer on the wafer is exposed at two different times with different lithographic masks. This allows for the illumination conditions to be optimised for the different lithographic masks but does not require additional resist layers nor additional etch steps. However, as with the double patterning method, the double exposure method requires two masks which increases the manufacturing costs and multiple passes in order to produce the layout pattern on the wafer which reduces through put. In addition, the combination of the two exposures cannot improve the minimum resolution limit which results in over sized contact holes.

U.S. Pat. No. 6,784,005 discloses using a photoresist reflow process to shrink isolated and random contact openings so that each of the contact openings have substantially the same critical dimension and to thereby enhance the resolution and the DoF of the contacts.

There is therefore a need for an improved method of forming openings, such as contact holes, in semiconductor devices.

SUMMARY

The present invention provides a method of forming openings to a layer of a semiconductor device and a semiconductor device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

A method of forming openings to a layer of a semiconductor device and a semiconductor device in accordance with the present disclosure will now be described, by way of example only, with reference to the accompanying drawings in which.

DETAILED DESCRIPTION OF THE DRAWINGS

In the description that follows and in FIGS. 1-7 and 10-13 certain regions are identified as being of a particular material, conductivity and/or type. However, this is merely for convenience of explanation and not intended to be limiting. Those of skill in the art will understand based on the description given herein that various semiconductor materials can be used and that the doping of various regions of the device may be altered in order to obtain different device functions.

The present disclosure will be described with reference to a semiconductor device comprising a transistor device such as a N-channel vertical MOSFET device. It will be appreciated that the disclosure is not limited to vertical devices nor N-channel MOSFET devices and applies equally to other semiconductor devices, such as lateral devices, P-channel vertical MOSFET devices or insulated gate bipolar transistor (IGBT) devices, or JFETs or diodes or similar devices or logic devices or complex ICs comprising a number of different semiconductor devices.

Briefly, a method of forming openings to a layer of a semiconductor device in accordance with an embodiment of the disclosure comprises forming a dielectric layer over the layer of the semiconductor device, forming a mask over the dielectric layer, the mask comprising a plurality of mask openings arranged in a regular pattern extending over the dielectric layer, the plurality of mask openings including a plurality of first mask openings and a plurality of second mask openings, each of the plurality of first mask openings being greater in size than each of the plurality of second mask openings, reducing the size of the plurality of second mask openings such that each of the second mask openings is substantially closed and removing portions of the dielectric layer through the plurality of first mask openings to provide openings extending through the dielectric layer to the layer.

The openings formed by the method in accordance with the disclosure may be any openings that extend between two layers of a semiconductor device. For example, the openings may include contact holes, trenches, vias, lines or any similar opening. The method provides particular advantages for openings having small or low tolerance dimensions in order to optimise, or at least improve, the DoF of the lithographic processes used to form the openings whilst not significantly increasing the cost e.g. by having multiple masks.

By having a masks with a regular pattern of mask openings (including mask openings for required openings and mask openings for not required openings), dense or otherwise, the illumination conditions used in the lithographic techniques to form the main mask may be selected so as to be optimum for the regular pattern ensuring an optimum process window, exposure latitude and DoF for maximum printability of openings.

The second mask openings, which correspond to openings that are not required, are used to form a dense regular pattern and to thus, increase the DoF and process window but are then closed so that they are not used in subsequent fabrication steps such as to form openings for removal of the dielectric layer.

The step of reducing the size of the plurality of second mask openings allow for those mask openings that correspond to openings which are not required to then be closed so that openings are not formed in the dielectric layer through these mask openings during the dielectric removal step. In addition, the step of reducing allows for those layout openings which correspond to openings which are required to be made larger on the lithographic mask which provides improved printability. The reduction step can then be used to shrink the mask opening to the correct size.

A MOSFET device typically comprises a plurality of transistor base cells which form the active area of the device surrounded by a termination area which extends from the active area to the edge of the device (i.e. the edge of the die). The active area typically uses minimum size features to minimise size or maximise density.

FIGS. 1-4 show a method of forming openings or contact holes. In the shown example, the contact holes are for the contacts of a transistor base cell 2 which forms an active area of a semiconductor transistor device. However, it will be apparent that the semiconductor device may be another type of device. In order to simplify the description, not all the features of a transistor base cell are shown. For example, the drain and source regions are not shown in the FIGS. 1-4.

Figure 1:
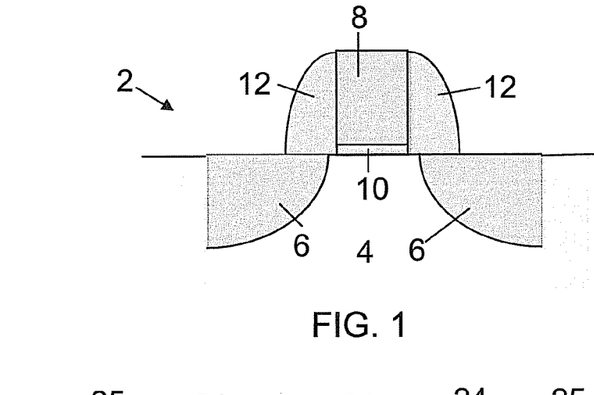
FIGS. 1-4 are simplified schematic cross-section diagrams of a portion of a semiconductor transistor device during different stages of fabrication in accordance with an embodiment of the disclosure.

The active area of the transistor base cell 2 includes p-type well or body regions 6 extending into the layer 4 which may be a substrate, such as a n-type semiconductor substrate or a layer provided on top of the substrate (not shown intermediate layers may be present between the substrate and the layer 4), such as a n-type epitaxial layer and a channel region (not shown) in the layer 4, which channel region is controlled by a gate region 8 formed over an oxide layer 10. The gate region 8 typically comprises a doped polycrystalline semiconductor material such as polysilicon or metal gate materials such as titanium nitride TiN or tantalum carbide TaC. Spacers 12 are formed to isolate the gate region 8 from subsequently formed metal contacts. Salicided regions 14 are formed in the body regions 6 and form contact regions of the device. The salicided regions 14 may be formed from NiPtSi.

Figure 2:
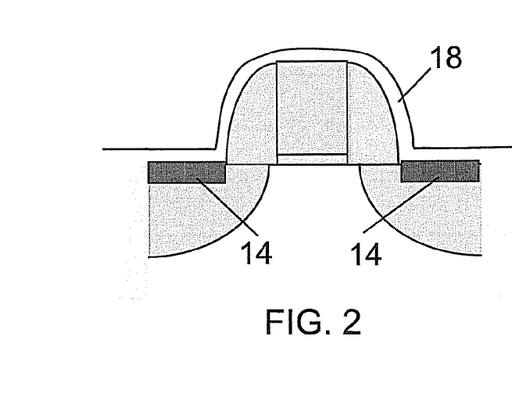
Figure 3:
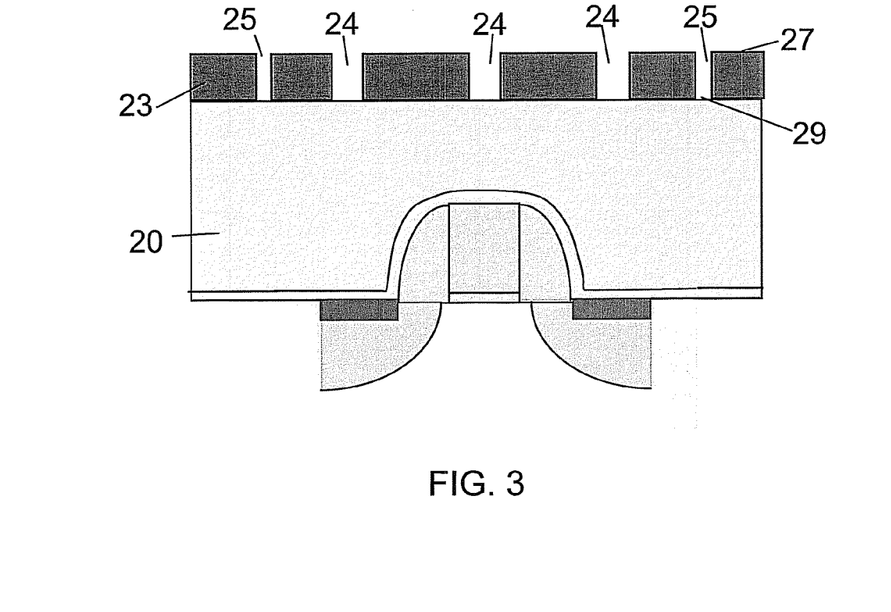

An etch stop layer 18 is then formed over the layer 4, and the spacers 12 (see FIG. 2). In FIG. 3, a pre-metal dielectric oxide layer 20, such as boron-doped glass PSG, is formed over the etch stop layer 18 and a mask 23 for defining the contact or mask openings 24, 25 is formed over the pre-metal dielectric oxide layer 20.

Some features, such as contact holes, vias, connection lines, have small dimensions and low manufacturing tolerances in order to avoid device failure; that is, they have small critical dimensions. Such features therefore require the use of critical masks which define the layout patterns for such features on the wafer with small dimensions and to a greater degree of accuracy than a non-critical mask. Critical masks are however more expensive than non-critical masks due to the small dimensions of the reticle, advanced mask technology (i.e. Phase Shift), the control of critical dimensions at the mask level (line width and registration) and the quality of the mask blank. In an embodiment of the disclosure mask 23 is a critical mask.

Figure 5:
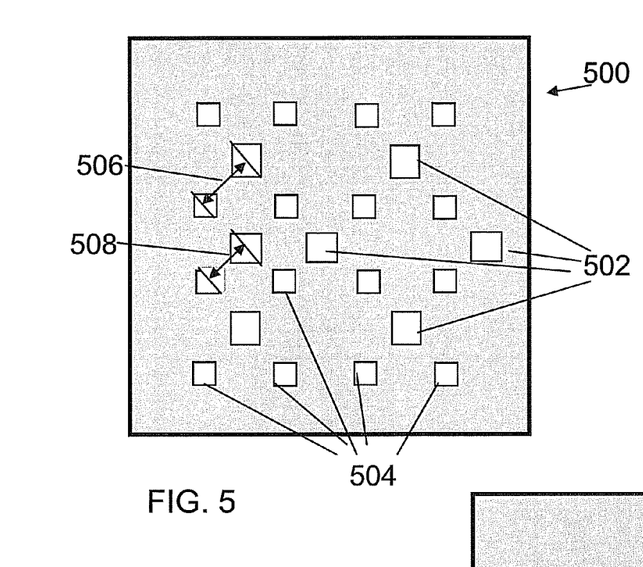
FIG. 5 is a top plan view of a layout pattern of layout openings for a layer of a semiconductor transistor device as used in the method in accordance with an embodiment of the disclosure.
Figure 6:
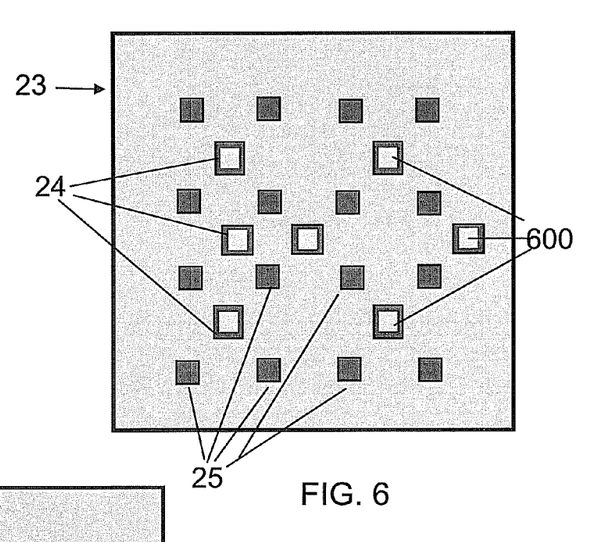
FIG. 6 is a top plan view of the mask openings of a mask formed from the layout pattern of FIG. 5.

A method of forming the mask 23 in accordance with an embodiment of the disclosure will now be described with further reference to FIGS. 5-7. FIG. 5 shows a layout pattern 500 for the contacts of a transistor device in accordance with an embodiment of the invention which is transferred to a lithographic mask or reticle. The layout pattern 500 is generated by a design tool as is well known in the art and comprises a plurality of layout openings 502, 504, arranged in a regular pattern or grid with the pitch 506 between adjacent layout openings being substantially the same. The pitch is the sum of the line width and space width for repeating patterns of lines and spaces and as can be seen by the pitches 506 and 508 shown in FIG. 5.

Not all the layout openings in the layout pattern 500 are used to form contacts on the semiconductor device. The layout pattern 500 includes a first group of layout openings 502 (which are required to form contacts) and a second group of layout openings 504 (which are not required to form contacts), with the size or critical dimension of each of the layout openings 502 in the first group being greater than the size or critical dimension of each of the layout openings 504 in the second group.

The first group of layout openings 502 that are required to form the contacts are identified during the design phase of the semiconductor device prior to the production of the lithographic mask and may be identified during the design of the layout patterns (e.g. according to the design rules) and/or using a technique such as Optical Proximity Correction (OPC). OPC is typically used to optimise, or at least to improve, the semiconductor device or IC layout, prior to the production of the reticle, so as to create an optimised reticle design layout. Typically, the OPC process involves identification of features that require optimisation. For instance, a rule based approach may be used to find features exhibiting particular properties, e.g. properties that may result in defects when the feature is transferred to the wafer. The distortion of features caused by the subsequent manufacturing process, including optical effects, may be simulated by the OPC process. This could include simulating the optical distortions and diffraction effects occurring when transferring the layout patterns to a wafer. Defects may be identified in the layout patterns should the simulated result fall outside any predetermined tolerances or fail comparison with any other particular criteria and can therefore be corrected. OPC is well known in the art. OPC is described in more detail in U.S. Pat. No. 5,705,301.

Thus, OPC or another method can be used to identify those layout openings 502 that are required to form the contacts. OPC or another design tool can also be used to identify where layout openings 504 (which are not required to form the contacts) are required to be positioned so as to provide a layout pattern 500 with a regular pattern or grid of layout openings. The position of the layout openings 504 which are not required for the contact openings may be arranged to provide for a minimum pitch between adjacent layout openings: in other words a dense regular pattern. An advantage of having a dense regular layout pattern having an minimum pitch between adjacent layout openings is that a significantly increased DoF and hence an improved lithography process window can be achieved.

Figure 8:
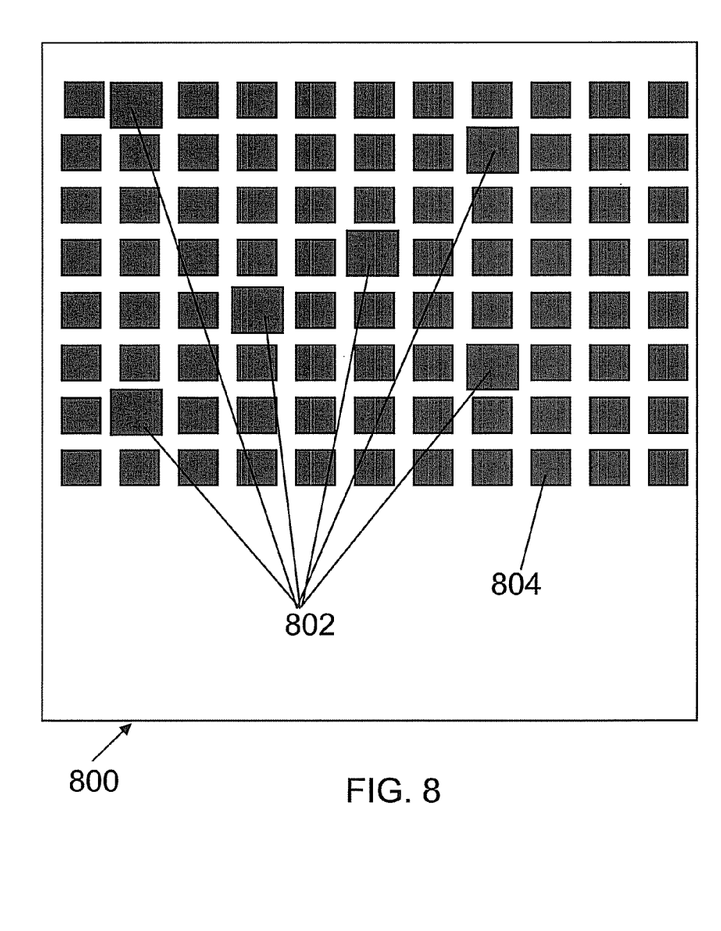
FIG. 8 is a top plan view of a layout pattern of dense layout openings for a layer of a semiconductor transistor device as used in the method in accordance with another embodiment of the disclosure.
Figure 9:
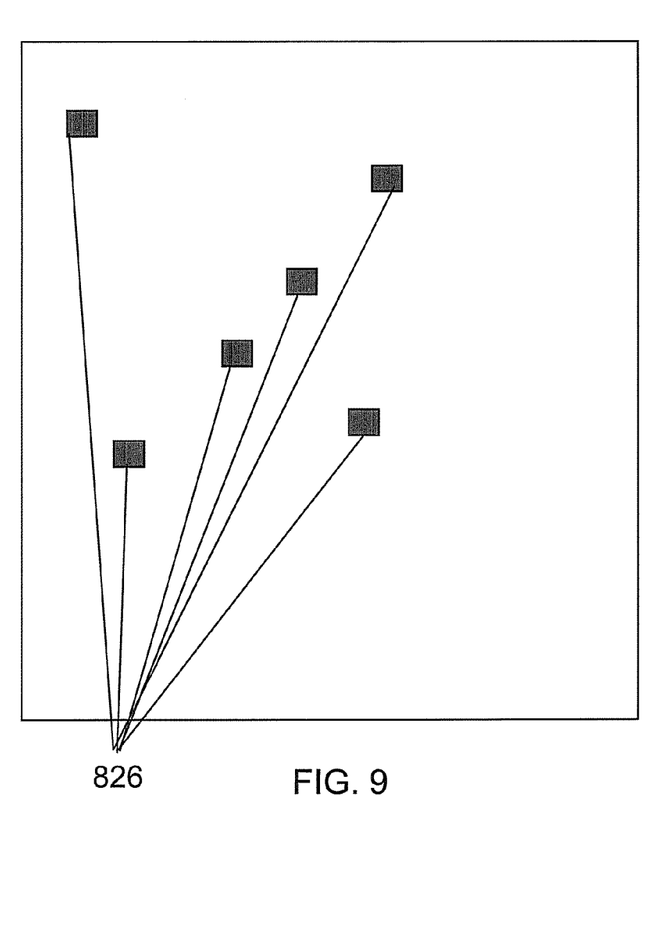
FIG. 9 is a top plan view of the contact openings formed from the mask openings of FIG. 8.

FIG. 8 shows a layout pattern 800 which is transferred to the lithographic mask in accordance with an embodiment of the disclosure. Layout pattern 800 has a dense regular pattern and includes a first group of layout openings 802 which are required to form contacts and a second group of layout openings 804 which are not required to form contacts. For a dense regular pattern, the pitch of the mask pattern is small. By having a regular pattern, dense or otherwise, the illumination conditions used in the lithographic techniques to form the main mask are selected so as to be optimum for the regular pattern ensuring an optimum process window and DoF. FIG. 9 shows the mask which is formed over the semiconductor device from the layout pattern 800 with mask openings 826 for forming the contact holes.

The layout pattern 500 is then reproduced on a lithographic mask or reticle in a mask shop as is well known in the art.

A layer of photosensitive material is formed over the pre-metal dielectric oxide layer 20. In an embodiment, the photosensitive material includes a resist material and further comprises an Anti-Reflective Coating (ARC). The ARC may be formed beneath the resist layer and in this configuration is known as bottom-ARC (or BARC) or on top of the resist layer and in this configuration is known as top-ARC or TARC. The resist/ARC layer is patterned by means of exposing the resist/ARC layer to light, such as UV light, through a reticle or lithographic mask including the layout pattern 500 and then the resist/ARC layer is developed to provide the mask 23 with mask openings 24, 25 (see FIGS. 3 and 6). Mask openings 24 correspond to the layout openings 502 which are required to form contacts and mask openings 25 correspond to layout openings 504 which are not required to form contacts.

The mask 23 is then subjected to a process whereby the size of the plurality of mask openings 25 which are not required to form contacts is reduced so that each of the plurality of mask openings 25 is substantially closed. The size of the mask openings 24 which are required to form contacts may also be reduced. This is shown in FIG. 6 by the smaller opening 600 in the mask opening 502. In an embodiment, a shrink process in an etch/deposition chamber is used, such as a plasma polymer deposition which is described in an article entitled 'A novel plasma-assisted shrink process to enlarge process windows of narrow trenches and contacts for 45 nm node applications and beyond' by Maaike Op De Beeck et al, in Advances in resist Material and Processing Technology XXIV, Proc. Of SPIE Vol. 6519, 65190U, (2007). Other processes which reduce the size of the mask openings in the resist layer may also be used.

In the plasma-assisted polymer deposition process described in the above article, a LAM Research 2300 Motif™ patterning system is used after the photolithographic process to deposit polymer on the top and side walls of the mask 23 including the mask openings 24, 25 by alternating deposition and etch steps, which results in a reduction in the size of the mask openings 24 and 25. During the deposition step, a conformal layer is deposited over all exposed surfaces with thicker polymer deposited on a top horizontal surface 27 (FIG. 3) of the mask 23 compared to the bottom horizontal surface 29 of the mask openings 24, 25. The following etch step removes polymer from the horizontal surfaces 27, 29 leaving a thin layer of polymer on the top horizontal surface 27 of the mask 23 while retaining the side wall coating in the mask openings 24, 25. Through the repetition of the deposition/etch cycles, the desired reduction in the size of the mask openings 25 can be obtained which results in the mask openings 25 being substantially closed. Typically, several shrink cycles are used in order to reduce the size of the mask openings 25 from 40 nm to substantially zero when the mask openings 25 are closed.

Figure 4:
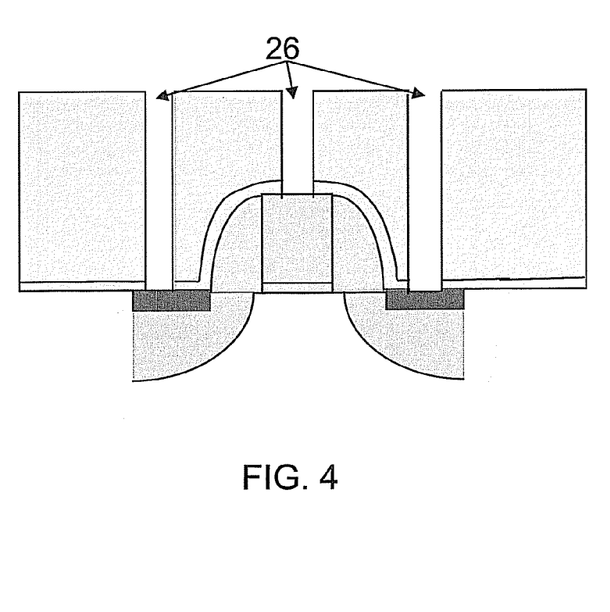
Figure 7:
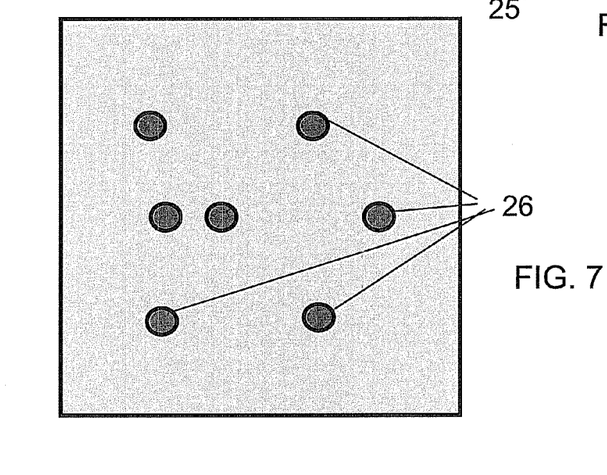
FIG. 7 is a top plan view of the contact openings formed from the mask openings of FIG. 6.

Once the mask openings 25 have been closed, openings or contact holes 26 are then formed in the pre-metal dielectric oxide layer 20 by etching the pre-metal dielectric oxide layer 20 through the 'open' mask openings 24 in the mask 23 and the mask 23 is then removed as shown in FIGS. 4 and 7. Since the openings 25 are substantially closed by the shrink process, the pre-metal dielectric oxide layer 20 is not etched through the openings 25.

Once the mask 23 has been removed, metal contacts are formed in the openings 26. The metal contacts are typically formed by depositing a barrier layer (not shown), such as a titanium nitride layer, in the openings 26 and then filling the openings 26 with a metal, such as tungsten. The barrier layer provides a barrier between the metal and dielectric layer 20.

In an embodiment the layout openings 502 which are required to form contacts are sized larger than the layout openings 504 which are not needed. In an embodiment, the size of the layout openings 504 is arranged to be approximately 0.85-0.90 times smaller than the minimum size specified for a contact hole for a particular technology. In an embodiment, the size of the layout openings 502 is arranged to be slightly greater than that that would be normally used for a contact hole; that is, slightly greater than the minimum size specified in the design rules for a contact hole for a particular technology. This allows for improvement in the printability and the ability to reduce the size of the mask opening 24 to the correct size for the device technology used. Furthermore, this permits for a larger mask opening to be printed which ensures a reduction in the Mask Error Enhancement Factor (MEEF). The size of the layout openings 502, 504 (and hence the mask openings 24, 25) are determined during the design phase and using tools such as an OPC process and the sizes are tuned for optimum conditions (e.g. maximum image intensity, optimum DoF, exposure latitude, and process window) and so that the mask openings 25 that are not required are closed by the shrink process and the mask openings 24 that are required are the correct size.

Figure 10:
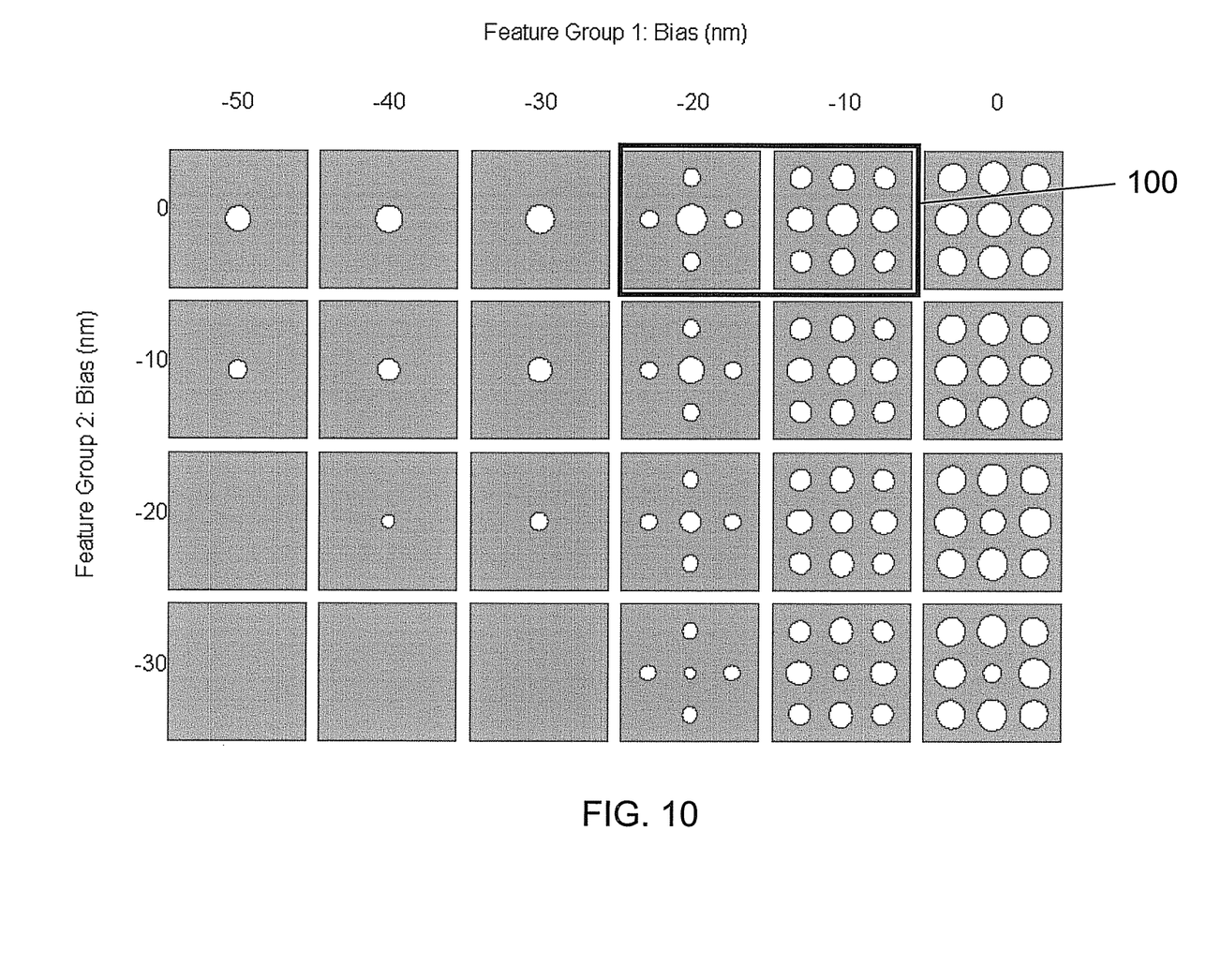
FIG. 10 is a graphical representation showing the printability of the mask openings for different sized layout openings of the layout pattern in FIG. 11.
Figure 11:
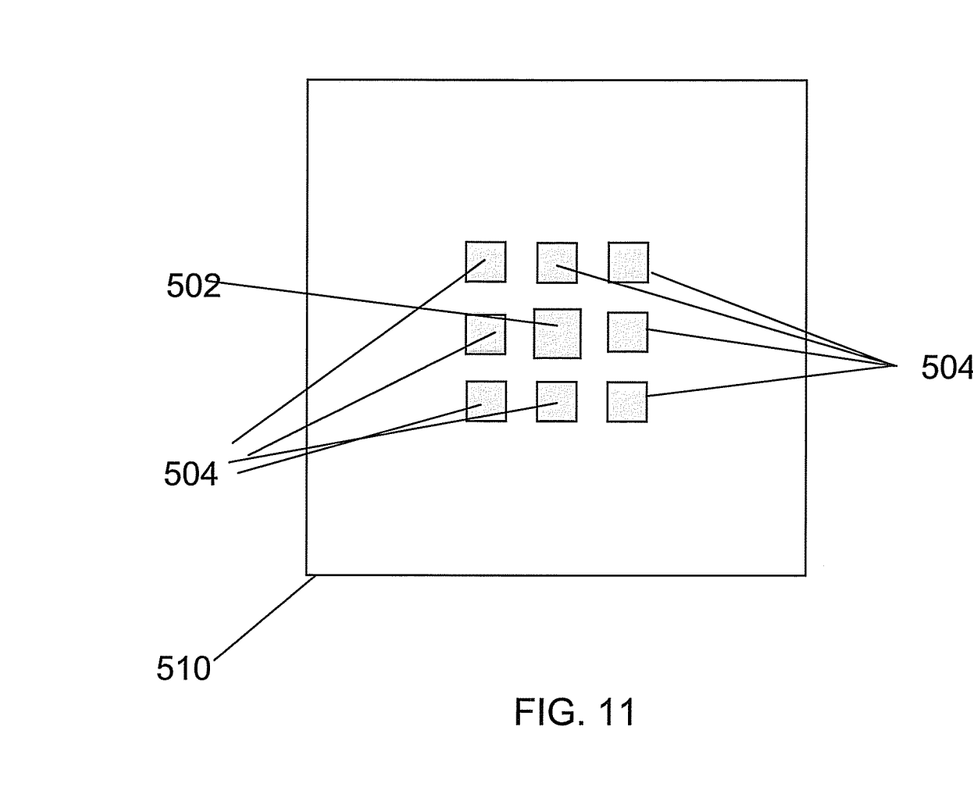
FIG. 11 is a top plan view of the layout pattern used to print the openings shown in FIG. 10.

FIG. 10 shows the impact of the different sizes of the layout openings 504 (feature group 1 on the X-axis) of the layout pattern 510 shown in FIG. 11 and corresponding to the openings not required, and of the layout opening 502 (feature group 2 on the Y-axis) of the layout pattern 510 shown in FIG. 11 and corresponding to the opening required, once the layout pattern 510 is printed onto a resist layer. For both axes, the initial bias is 20 nm (i.e. for value 0 on the X and Y axis) which results in a mask opening which is printed onto the resist layer having a size of 70 nm. The box 100 shows the possible combinations of sizes for the layout openings 502 and 504 which when printed form the optimum combination of mask openings: in other words, the possible combinations of sizes which provide a mask opening 502 which is large enough to form an opening or contact opening of the required size with mask openings 504 having a smaller size so that these openings can be closed by a shrink process whilst also maximising DoF, exposure latitude etc.

As an example, if the target critical dimension for an opening after etch is 60 nm (as drawn), the size or critical dimension of an opening 502 in the layout pattern is chosen so that the opening formed in the mask post-lithography has a size 85 nm, and the size of the opening 504 in the layout pattern is chosen to be 50% of the size of the opening 502. A 43 nm shrink process is used to close the openings in the mask that are not required (and corresponding to openings 504) with the result that the size of the required openings (corresponding to openings 502) is 42 nm. A descum process, as is well known in the art, is then used to increase the size or critical dimension of the 42 nm mask openings by 18 nm to 60 nm and the contact holes are then formed by an etch process through the mask openings.

As discussed above, the positioning of the layout openings 504 so as to form a regular pattern or dense grid and the sizing of the layout openings 502 and 504 is performed during the design of the layout using the design rules for the technology plus using tools such as OPC.

Figure 12:
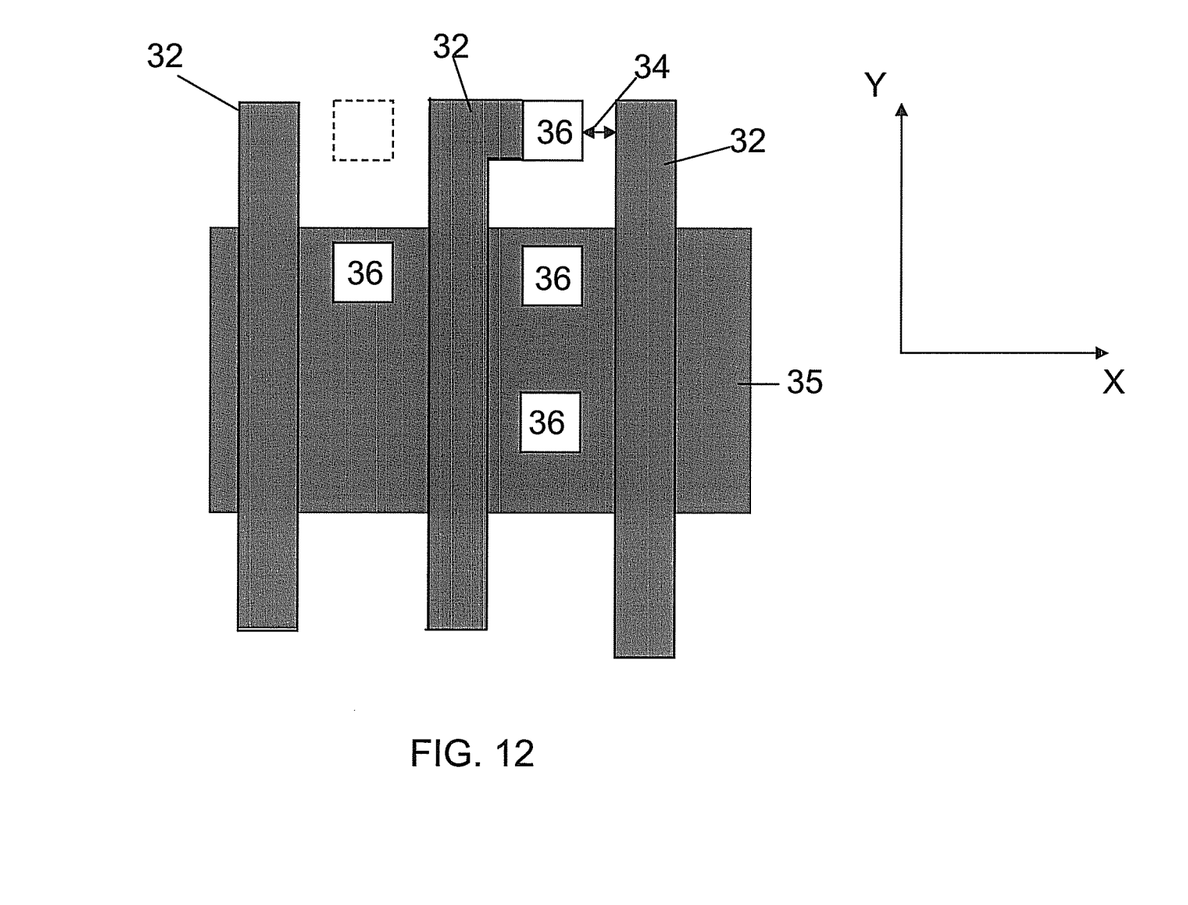
FIG. 12 is a simplified top plan view of a design layout for part of a layer of a semiconductor transistor device showing the position of the contact openings formed by a method in accordance with a first embodiment of the disclosure.

When implementing the plurality of mask openings arranged in a grid or regular pattern, depending on the design of the semiconductor device, there may be conflicts with other requirements of the design. For example, a regular pattern of mask openings with a minimum pitch of 90 nm provides improved printability due to increased DoF but may result in the distance between a contact 36 (for example a drain or source contact) and a polysilicon gate 32 as seen in FIG. 12 being too small or the distance 34 between two polysilicon gates 32 being too small, according to the design rules. If the design rules are not followed, defects in the device may result. FIG. 12 shows the layout of part of a layer of a semiconductor transistor device formed by a method in accordance with a first embodiment of the disclosure including polysilicon gates 32, a source/drain region 35 and contacts 36. As can be seen in FIG. 12, the contacts 36 and polysilicon gates 32 are orientated in planes parallel to the y axis.

Furthermore, 45 nm (and beyond) CMOS processes require the gates to have a regular grid and when implementing the plurality of mask openings arranged in a grid or regular pattern in accordance with this disclosure, the contacts will also be arranged in regular grid. In order to minimize layout complexity (jogs, corners, etc.), an optimum configuration is to arrange for the gate contacts to land on the same x pitch as the gates (x position of gate contact=N×gate pitch, where N is an integer) and to arrange for the source/drain contacts to land at half the distance between gates (x position of source/drain contacts=(N+0.5)×gate pitch).

Figure 13:
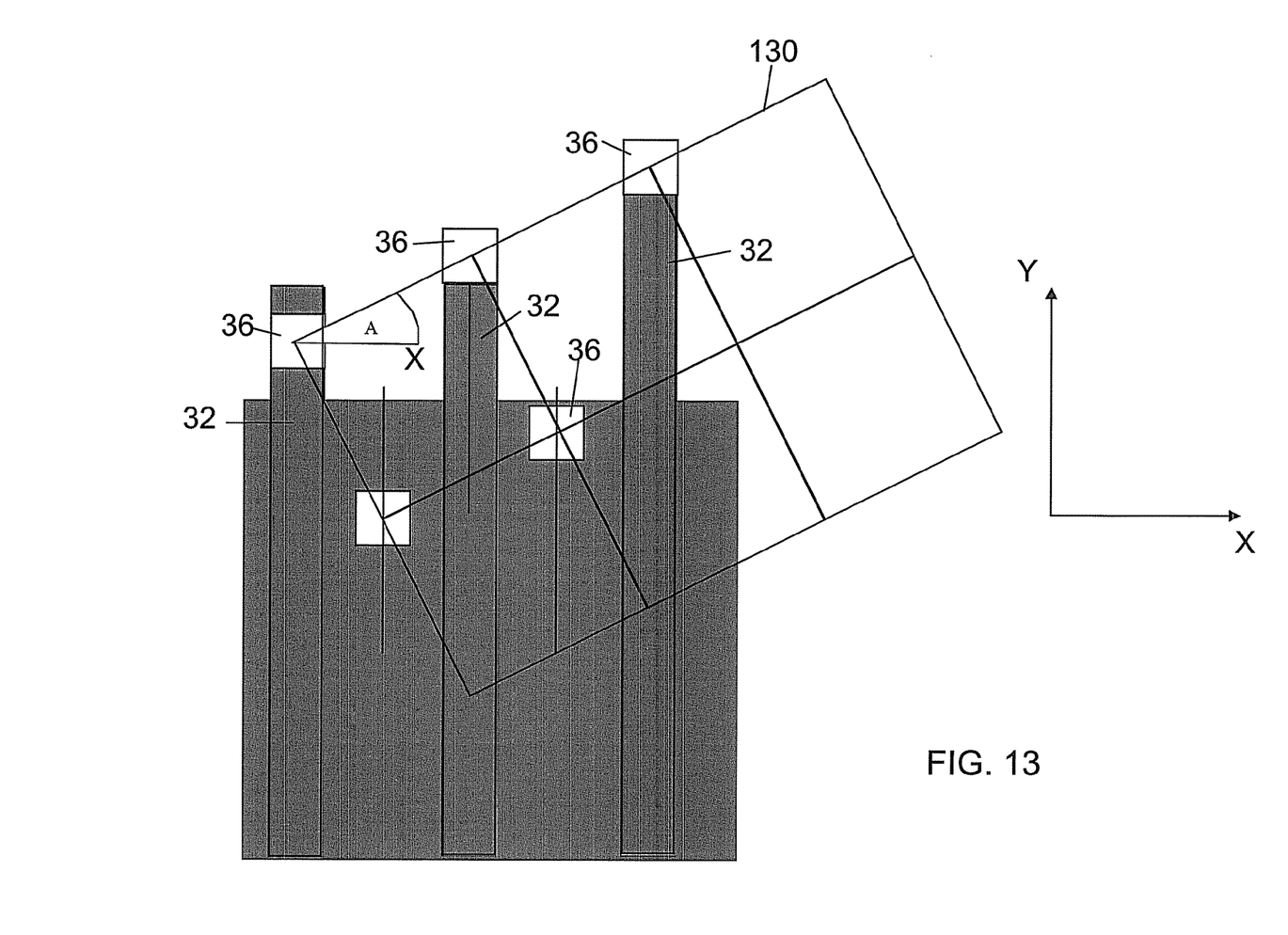
FIG. 13 is a simplified top plan view of a design layout for part of a layer of a semiconductor transistor device showing the position of the contact openings formed by a method in accordance with a second embodiment of the disclosure.

In a second embodiment, the regular pattern of the plurality of mask openings is arranged to be orientated with respect to an xy axes of a design layout for the semiconductor device as shown in FIG. 13 such that a line 130 through the centres of a line of contacts 36 which are formed by the mask openings 24 is at an angle A to the x axis of the design layout. The angle A may be 45° or according to the following equation.

$$A = \text{ArcTan}(0.5/N) \quad \text{Equation (1)}$$

Where N is an integer (1, 2, 3, . . . ).

Thus, A may be 45° or 26.57°, 14.94°, 9.46° etc.

Having the regular pattern of the plurality of mask openings orientated at an angle A of 45° or at an angle A according to equation (1) above means that the contacts 36 can be positioned with a pitch CP of:

$$CP = P/\cos A$$

Where P is the pitch between two adjacent gates.

This ensures improved printability but also ensures that design rules for, for example, poly-poly space are followed. In addition, the rotation of the contact grid in accordance with the second embodiment of the disclosure allows for the optimum configuration for the 45 nm (and beyond) CMOS processes as described above.

The method in accordance with the disclosure allows for openings to be formed between layers in a semiconductor device that improves the process window and DoF but which does not require expensive double patterning techniques or double exposure techniques. In the embodiment described above, an adapted OPC technique is used to provide the lithographic mask with the plurality of layout openings in a regular grid or pattern and a shrink process is used to shrink the mask openings not required to form the openings. These steps are significantly less expensive than using double patterning and double exposure techniques.

It will be appreciated that in the future as the dimensions of device features decrease so that pitch size becomes smaller, the method in accordance with the disclosure can still be used in the lithographic processes for manufacturing such devices since it can optimise DoF for small pitch features.

In the foregoing specification, the invention has been described with reference to specific examples of embodiments of the invention. It will, however, be evident that various modifications and changes may be made therein without departing from the broader scope of the invention as set forth in the appended claims.

For example, the semiconductor substrate described herein can be any semiconductor material or combinations of materials, such as gallium arsenide, silicon germanium, silicon-on-insulator (SOI), silicon, monocrystalline silicon, the like, and combinations of the above.

However, other modifications, variations and alternatives are also possible. The specifications and drawings are, accordingly, to be regarded in an illustrative rather than in a restrictive sense.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

In the claims, any reference signs placed between parentheses shall not be construed as limiting the claim. The word 'comprising' does not exclude the presence of other elements or steps then those listed in a claim. Furthermore, the mere fact that certain measures are recited in mutually different claims does not indicate that a combination of these measures cannot be used to advantage.

The invention claimed is:

1. A method of forming openings to a layer of a semiconductor device comprising:
   forming a dielectric layer over the layer of the semiconductor device;
   forming a mask over the dielectric layer, the mask comprising a plurality of mask openings arranged in a pattern extending over the dielectric layer, the plurality of mask openings including a plurality of first mask openings and a plurality of second mask openings, each of the plurality of first mask openings being greater in size than each of the plurality of second mask openings;
   reducing the size of the plurality of second mask openings such that each of the second mask openings is substantially closed, wherein reducing the size of the plurality of second mask openings comprises depositing a polymer over the mask and etching the deposited polymer and repeating the depositing and etching until the second mask openings are substantially closed; and
   removing portions of the dielectric layer through the plurality of first mask openings to provide openings extending through the dielectric layer to the layer.

2. A method according to claim 1, wherein forming a mask comprises:
   providing a layout pattern for a layer of a semiconductor device including a plurality of first layout openings and a plurality of second layout openings arranged in a pattern, the size of the second layout openings being less than the size of the first layout openings;
   forming a layer of photosensitive material over the dielectric layer; and
   transferring the layout pattern to the layer of photosensitive material to form the mask over the dielectric layer, the first layout openings forming the first mask openings and the second layout openings forming the second mask openings.

3. A method according to claim 2, wherein the providing a layout pattern comprises:
   providing a layout pattern for a layer of a semiconductor device including the plurality of first layout openings; and
   adding the plurality of second layout openings to the layout pattern such that the layout pattern includes the plurality of first and second layout openings arranged in a pattern.

4. A method according to claim 3, wherein the providing and adding steps are performed by an OPC process.

5. A method according to claim 1, wherein the first mask openings correspond to the openings to be formed to the layer.

6. A method according to claim 1, wherein the pattern is a dense pattern.

7. A method according to claim 1, wherein a pitch between adjacent first and second mask openings is substantially the same.

8. A method according to claim 1, wherein the pattern of the plurality of mask openings is orientated with respect to an xy axes of a design layout for the semiconductor device such that a line through the centres of a line of the mask openings is at an angle A that is skewed relative to the x axis of the design layout.

9. A method according to claim 8, wherein the angle A is 45° or is given by the following equation:

$$A = \text{ArcTan}(O.5/N)$$

where N is an integer (1, 2, 3, ... ).

10. A method as claimed in claim 1, further comprising forming an additional layer over the dielectric layer and wherein the openings are arranged to extend between the layer and the additional layer.

11. A method as claimed in any preceding claim 1, wherein the openings are at least one of contact holes, vias, lines and trenches.

12. A method according to claim 2, wherein the first mask openings correspond to the openings to be formed to the layer.

13. A method according to claim 3, wherein the first mask openings correspond to the openings to be formed to the layer.

14. A method according to claim 2, wherein the pattern is a dense pattern.

15. A method according to claim 3, wherein the pattern is a dense pattern.

16. A method according to claim 2, wherein a pitch between adjacent first and second mask openings is substantially the same.

17. A method according to claim 3, wherein a pitch between adjacent first and second mask openings is substantially the same.

18. A method according to claim 1, wherein the second mask openings have a size of substantially zero following reducing the size.

19. A method according to claim 1, wherein, during removing portions of the dielectric layer, the dielectric layer is not removed through the substantially closed second mask openings.

20. A method according to claim 1, wherein the pattern includes a grid pattern.

* * * * *